(12) United States Patent
Naseem et al.

(10) Patent No.: US 6,844,248 B2
(45) Date of Patent: Jan. 18, 2005

(54) METHOD OF DOPING SILICON, METAL DOPED SILICON, METHOD OF MAKING SOLAR CELLS, AND SOLAR CELLS

(75) Inventors: Hameed A. Naseem, Fayetteville, AR (US); M. Shahidul Haque, Fayetteville, AR (US); William D. Brown, Fayetteville, AR (US)

(73) Assignee: The Trustees of the University of Arkansas, Little Rock, AR (US)

( * ) Notice: Subject to any disclaimer, the term of this patent is extended or adjusted under 35 U.S.C. 154(b) by 0 days.

(21) Appl. No.: 10/617,698

(22) Filed: Jul. 14, 2003

(65) Prior Publication Data

US 2004/0106227 A1 Jun. 3, 2004

Related U.S. Application Data

(62) Division of application No. 10/029,859, filed on Dec. 31, 2001, now Pat. No. 6,613,653, which is a division of application No. 08/855,229, filed on May 13, 1997, now Pat. No. 6,339,013.

(51) Int. Cl.[7] .............................................. H01L 21/20
(52) U.S. Cl. ...................... 438/486; 438/482; 438/682; 438/597
(58) Field of Search .............................. 438/597, 682, 438/683, 482, 486

(56) References Cited

U.S. PATENT DOCUMENTS

| | | | |
|---|---|---|---|
| 4,165,558 A | 8/1979 | Armitage, Jr. et al. | 438/93 |
| 4,190,852 A | 2/1980 | Warner, Jr. | 438/80 |
| 5,529,937 A * | 6/1996 | Zhang et al. | 438/471 |
| 5,538,564 A | 7/1996 | Kaschmitter | 438/93 |
| 5,543,352 A | 8/1996 | Ohtani et al. | 438/487 |
| 5,562,781 A | 10/1996 | Ingram et al. | 438/96 |
| 5,589,008 A | 12/1996 | Keppner | 438/98 |
| 5,595,944 A | 1/1997 | Zhang et al. | 437/41 |
| 5,646,424 A | 7/1997 | Zhang et al. | 257/66 |
| 5,700,333 A | 12/1997 | Yamazaki et al. | 438/97 |
| 5,711,824 A | 1/1998 | Shinohara et al. | 438/98 |
| 5,730,808 A | 3/1998 | Yang et al. | 438/97 |
| 5,940,693 A * | 8/1999 | Maekawa | 438/166 |

FOREIGN PATENT DOCUMENTS

WO WO97/13280 4/1997

OTHER PUBLICATIONS

Haque, M. et al., "Hydrogenated Amorphous Silicon/Aluminum Interaction at Low Temperatures," *Materials Research Society Symposium*, vol. 258, 1992, pp. 1037–1042.

Haque, M. S. et al., "Degradation and Failure Mechanisms of a–Si:H Solar Cells with Aluminum Contacts," *IEEE First ECPEC*, 1994, pp. 642–645.

Luque, A. et al., "Internal Quantum Efficiency of Back Illuminated $n^+ pp^+$ Solar Cells," *Revue De Physique Appliquee*, Dec. 1978, pp. 629–632.

(List continued on next page.)

*Primary Examiner*—Van Thu Nguyen
*Assistant Examiner*—Brad Smith
(74) *Attorney, Agent, or Firm*—James H. Meadows; Medicus Associates

(57) ABSTRACT

A low temperature process for forming a metal doped silicon layer in which a silicon layer is deposited onto a substrate at low temperatures, with a metal doping layer then deposited upon the silicon layer. This structure is then annealed at low temperatures to form a metal doped semiconductor having greater than about $1 \times 10^{20}$ dopant atoms per $cm^3$ of silicon.

50 Claims, 10 Drawing Sheets

AAP Sample

OTHER PUBLICATIONS

Czbatyj, W. et al., "Comparison of low temperature polysilicon crystal growth on low cost substances," *J. Vac Sci Technol. A*, vol. 9, No. 2, Mar./Apr. 1991, pp. 294–298.

Mayer & Lau, "Metallization and Phase Diagrams," *McMillan Publishing*, 1998, pp. 276–283.

Francis, David H., "Trends in Flip Chip and Advanced Interconnection," *1997 International Conference on Multichip Modules*, pp. 25–28.

Al–Nuaimy, E.A., "Excimer laser crystallization and doping of source and drain regions in high quality amorphous silicon thin film transistors," *Appl. Phys. Lett.* 69(25), Dec. 16, 1996, pp. 3857–3859.

Smith, P.M. et al., "Excimer laser crystallization and doping of silicon films on plastic substrates," *Appl. Phys. Lett.* 70(3), Jan. 20, 1997, pp. .342–344.

Konenkamp, R. et al., "Reversible Doping of Hydrogenated Amorphous Silicon," *Solid State Communications*, 1990, vol. 3, No. 5, pp. 323–326.

Saito, N. et al., "Doping effects of aluminum on the properties of hydrogenated amorphous silicon–carbon alloy films prepared by magnetron sputtering," *Philosophical Magazine B*, 1990, vol. 62, No. 5, pp. 527–536.

Berry, W.B., "Low Temperature Diffusivity for Aluminum and Silver in Amorphous Silicon."

Lathrop, J.W. et al., "Failure Mechanisms in Amorphous Silicon Solar Cells."

Fukada, N., "Thermal Degradation of a–Si:H Solar Cells," *Technical Digest of the International PVSEC–1*, Kobe, Japan, pp. 229,231.

Lathrop, J.W., "Accelerated Stress Testing of a–Si:H Cells," *Proc. 2nd Int. Photovoltaic Science and Engineering Conference*, Beijing, China, Aug. 1986, pp. 386–389.

Delahoy, A.E., "Amorphous Silicon–Aluminum Materials," *Research on High Efficiency Single Junction Monolithic Thin Film a–Si Solar Cells*, Nov. 1985, pp. 13–20.

Willing, F. et al., "Thermal Stability of Interconnected a–Si:H Solar Modules."

Baert, K.A. et al., "Amorphous–Silicon Solar Cells with Screen–Printed Metallization," *IEEE Transactions on Electron Devices*, vol. 37, No. 3, Mar. 1990, pp. 702–706.

Ishihara, S. et al., "Low–temperature crystallization of hydrogenated amorphous silicon films in contact with evaporated aluminum electrodes," *J. Appl. Phys.* 62(3), Aug. 1, 1987, pp. 837–840.

Haque, M.S. et al., "Aluminum–induced crystallization and couter–doping of phosphorous–doped hydrogenated amorphous silicon at low temperatures," *J. Appl. Phys.* 79(10), May 15, 1996, pp. 7529–7536.

Haque, M.S. et al., "Aluminum–induced degradation and failure mechanism of a–Si:H Solar Cells," *Solar Energy–Materials and Solar Cells*, Jun. 1996, pp. 543–555.

Haque, M.S. et al., "Interaction of aluminum with hydrogenated amorphous silicon at low temperatures," *J. Appl. Phys.* 75(8), Apr. 15, 1994, pp. 3928–3935.

Radnoczi et al., "Al induced and Sb–doped crystallization of a–Si", May 1, 1991, Journal of Applied Physics, vol. 69, No. 9, pp. 6394–6399.

Gong et al., "Al–doped and Sb–doped polycrystalline silicon obtained by means of metal–inductied crystallization", Nov. 1, 1987, Journal of Applied Physics, vol. 62, No. 9, pp. 3726–3732.

\* cited by examiner

100 C Annealed

180 C Annealed

250 C Annealed

ABP Sample

100 C Annealed

180 C Annealed

250 C Annealed

AAP Sample

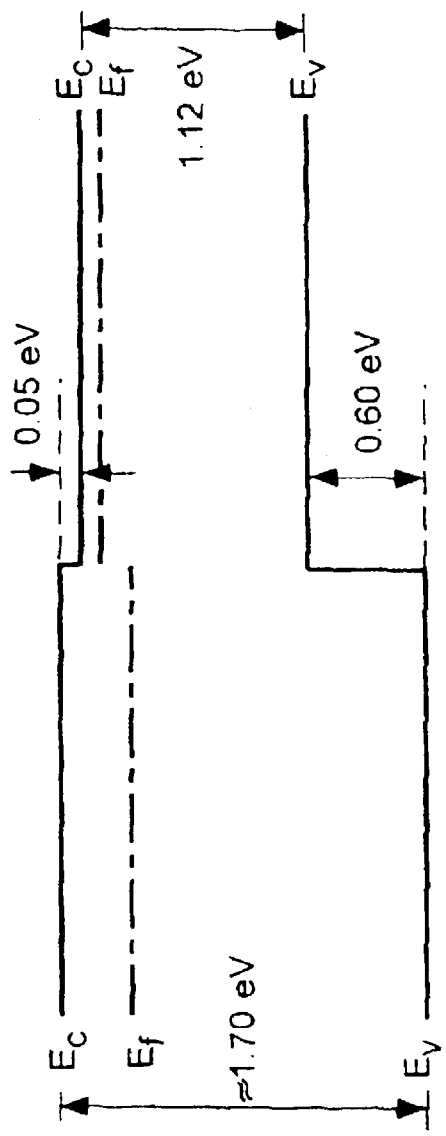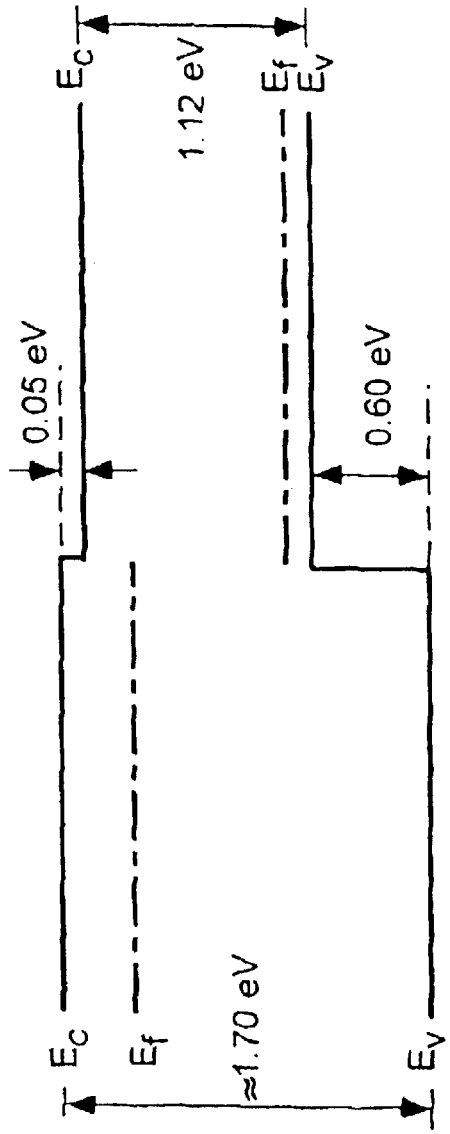
FIG. 8A
FIG. 8B

METHOD OF DOPING SILICON, METAL DOPED SILICON, METHOD OF MAKING SOLAR CELLS, AND SOLAR CELLS

CROSS-REFERENCE RELATED APPLICATIONS

This application is a division of Application No. 10/029,859 filed Dec. 31, 2001, now U.S. Pat. No. 6,613,653 which is a division of application Ser. No. 08/855,229 filed May 13, 1997, now U.S. Pat. No. 6,339,013.

BACKGROUND OF THE INVENTION

1. Field of the Invention

The present invention relates to a method of making doped semiconductors, to doped semiconductors and to products made thereof.

In another aspect present invention relates to a method of making doped silicon, to doped silicon and to products made thereof.

In even another aspect, the present invention relates to a method of making solar cells, to solar cells and to products including such solar cells.

2. Description of the Related Art

Solar cells as a potential source of energy were discovered and developed in the 1950's at Bell Labs.

For certain applications, solar cells are viewed as the only practical power source. For example, for orbiting space satellites, with payload weight for fuel at a premium, and refueling a very difficult and costly proposition, solar cells serve to power the satellite through its orbit. As another example, unmanned exploratory space probes, which lack not only suitable payload space for fuel, but which cannot be refueled are powered by solar cells.

For terrestrial applications, solar power has long been hailed as an ideal fuel source. Solar power is environmentally clean and appears, in comparison to human lifespans and needs, to be an infinitely renewable power source. Some studies assert that less than 0.3% of the surface of earth could be covered with solar cells to meet all the energy needs of the world.

It has long been understood that for solar power to become used not only for specialized uses, but for common every day applications, it must become economic. During the late 1970's and early 1980's with ever escalating fossil fuel prices, it was believed that solar power would be economical by the 1990's. However, lack of noticeable advancements in solar energy technology, combined with stabilization of fossil fuel prices, has not been helpful in promoting the use of solar power.

At present, solar power provides a mere fraction (less than about 0.01%) of the current power usage of the whole world. The general trend appears to be in the direction of increased solar power usage. The cost of solar generated energy has been steadily going down since 1960's as its production has been going up. Even at the current average price of near $3 per peak watt there exists a large market such as in remote telecommunication repeaters, fibre optic amplifiers, remote street signs, telephone booths along highways, or lights, and remote homes and cabins. Further reduction in cost will only serve to open up the market for utility scale power generation.

The first amorphous Si:H solar cell was produced in 1976 at the RCA laboratories by Carlson and Wronsky. Immediately after its discovery, the a-Si:H solar cell made the transition from laboratory research to commercialization due to its cost effectiveness. While these a-Si:H solar cells are now being used in many solar energy operated electronic products, low efficiency, degradation during long usage, and other deficiencies have prevented it from becoming a viable power source in many applications.

Polycrystalline and single crystalline silicon technology currently holds about 82% of the world wide solar cell market. In 1995 this amounted to about 67 MWatts of power generated which translates to a 200 million dollar market. Photovoltaic power generation is increasing at a phenomenal rate and it is projected that by the year 2010, about 10% of the utility bulk power will be derived from the photovoltaic solar cells. Making these crystalline silicon solar cells at low cost will push its insertion into the power market even faster. The current crystalline/multi-crystalline silicon solar cell fabrication technology involves diffusion steps which require temperatures as high as 1100° C. and metallization steps which require sintering temperatures as high as 600° C. Most of the crystalline silicon solar cells in the market are made of multi-crystalline silicon substrates as they are much cheaper and available in larger sizes. Unfortunately, high temperature diffusion causes diffusion spikes along the grain boundaries in multi-crystalline silicon solar cells possibly causing device degradation and failure. Additionally, with larger substrate sizes, it is extremely difficult to maintain relatively uniform diffusion across the substrate.

Current fabrication technology also requires a separate anti-reflection coating to reduce reflection losses and increase efficiency. Current fabrication technology further requires a step to create a rough surface texture to reduce reflection losses and increase light trapping. This mechanical texturing step increases fabrication costs.

Finally, current fabrication technology also requires a hydrogen passivation step, generally hydrogen plasma passivation, to passivate the grain boundries in multi-crystalline silicon solar cells.

However, in spite of the many advancements in the prior art, the prior art suffers from the disadvantages as detailed above.

Thus, there is still a need for an improved method of making solar cells, and for improved solar cells made therefrom.

There is another need in the art for a method of making solar cells which does not require high temperature diffusion steps or metallization steps, and for improved solar cells made therefrom.

These and other needs in the art will become apparent to those of skill in the art upon review of this specification, including its drawings and claims.

SUMMARY OF THE INVENTION

It is an object of the present invention to provide for an improved method of making solar cells, and for improved solar cells made therefrom.

It is another object of the present invention to provide for a method of making solar cells which does not require high temperature diffusion steps or metallization steps, and for improved solar cells made therefrom.

These and other objects of the present invention will become apparent to those of skill in the art upon review of this specification, including its drawings and claims.

According to one embodiment of the present invention, there is provided a method of forming a polycrystalline semiconductor layer on a substrate. The method generally includes depositing a semiconductor onto the substrate to form an amorphous semiconductor layer. The method further includes depositing a metal onto the semiconductor layer to form a structure comprising the substrate, amorphous semiconductor layer and a doping metal layer. The method even further includes annealing the structure at a temperature in the range of about 170° C. to about 600° C. to convert at least a portion of the amorphous semiconductor layer into polycrystalline. Suitable examples of semiconductor include silicon, germanium, silicon-germanium alloys, germanium-carbon alloys, silicon-carbon alloys, and silicon-nitrogen alloys According to another embodiment of the present invention, there is provided metal doped silicon. The doped silicon generally includes polycrystalline silicon comprising greater than about $1 \times 10^{20}$ dopant atoms per $cm^3$ of silicon.

BRIEF DESCRIPTION OF THE DRAWINGS

FIGS. 8A and 8B show the conceptional band structures of n-type a-Si:H with (a) n-type and (b) p-type c-Si.

DETAILED DESCRIPTION OF THE INVENTION

Cleaning Step

Figure 1D:
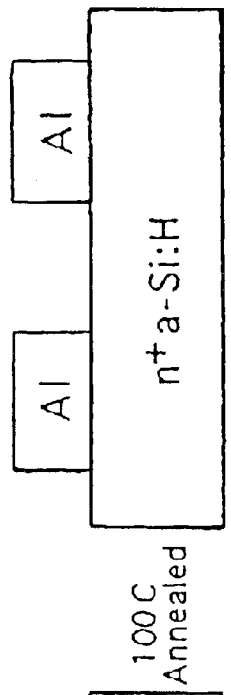
FIGS. 1A–F are representations showing preparation of n type a-Si:H samples on oxidized silicon substrate with FIGS. 1A–C showing "annealed after patterning" (AAP) samples and with FIGS. 1D–F showing "annealed before patterning" (ABP) samples.
Figure 1E:
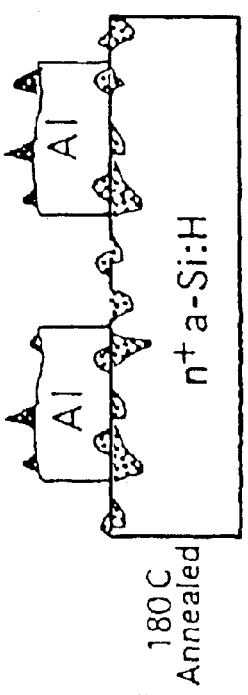
Figure 1F:
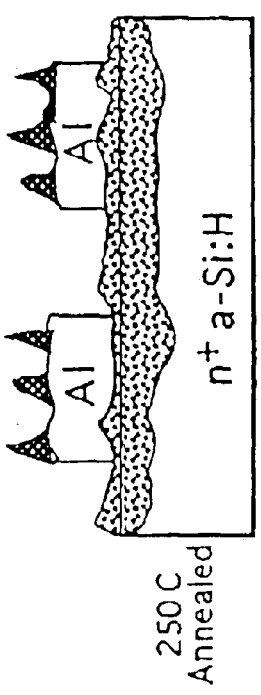
Figure 1A:
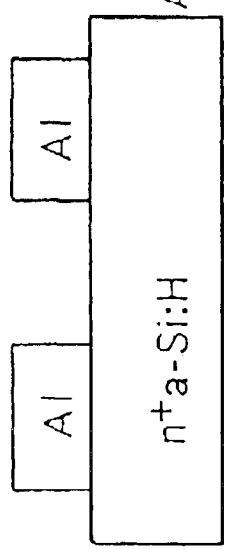
Figure 1B:
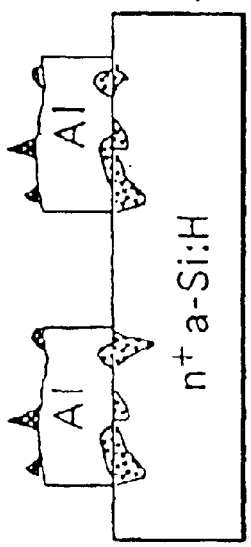
Figure 1C:
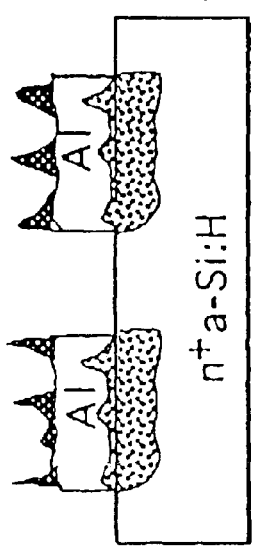

The method of the present invention includes an optional cleaning step in which the substrate is cleaned. Generally, any suitable cleaning method may be utilized, including contact cleaning with a cleaning solution as are well known in the art. Suitable cleaning solutions include various sequential applications of strong acids strong bases, and strong solvents.

The cleaning may be carried out at any temperature suitable to provide proper cleaning, while not causing any undue degradation of the substrate. Generally, the cleaning is carried out at ambient temperature and pressure. The cleaning solution must be substantially removed from the substrate after cleaning, which removal is generally accomplished by water rinse thereof.

Base Deposition Step

Once the substrate has been prepared, the method of the present invention further includes deposition of an intrinsic or doped (n-type or p-type) amorphous silicon film on the substrate.

By amorphous, it is generally meant that the deposited layer will have at least a portion of the layer that is noncrystalline, that is having no molecular lattice structure which is characteristic of the solid state. Preferably, the deposited layer will be substantially amorphous, although it can include portions having crystallinity on a nano or micro-crystalline scale. More preferably, the deposited layer will be entirely amorphous having no or substantially no crystallinity.

The deposition of the silicon film is generally carried out at any suitable substrate temperature that is less than the temperature at which the substrate shows any substantial dimensional or physical change. Preferably, the deposition of the silicon film is carried out at a substrate temperature less than about 400° C., more preferably less than about 250° C., and even more preferably less than about 50° C., and still more preferably at less than ambient temperature.

This deposition step may be carried out by any method suitable to form the amorphous silicon film on the substrate. As non-limiting examples, the deposition may by accomplished by physical or chemical vapor deposition, such as plasma enhanced chemical vapor deposition, evaporation or by sputtering.

The present invention is not limited to any particular thickness for the deposited silicon film, as such thickness will vary depending upon the ultimate desired end use of the film.

This base deposition step is generally carried out under conditions suitable to form the amorphous silicon structure.

Acid Wash Step

Once the silicon film is deposited upon the substrate, it may be necessary to clean the silicon film. Foreign substances may gather on the film, or an oxide layer may form thereon. Optionally, the substrate is then contacted with a cleaning solution to remove any contaminants and undesirable oxide layers thereon. Preferably, the cleaning solution is a strong acid or strong base. Non-limiting examples of suitable cleaning solutions include hydrofluoric acid (HF) or buffered oxide etching solution.

Metal Deposition Step

Once the silicon film has been cleaned with the acid, the next step is to deposit a thin metal film onto the silicon film layer, wherein the metal is selected to form the silicon film layer into either a p-type, n-type or intrinsic structure.

The thickness of the metal film will be any thickness suitable as desired. It is generally desired that the metal film substantially cover the silicon film layer.

Suitable doping metals for use in the present invention are selected from transition metals, and groups III, IV and V of the periodic table.

This doping metal deposition step may be carried out by any method suitable to form the doping metal layer on the silicon film. As non-limiting examples, the deposition may be accomplished by thermal evaporation or by sputtering.

Annealing

Once the doping metal layer has been deposited onto the silicon layer, the formed structure is then annealed for a suitable time at a suitable annealing temperature.

Generally, annealing temperatures are in the range of about 170° C. to about 600° C., preferably in the range of about 200° C. to about 450° C., and more preferably in the range of about 200° C. to about 300° C. It is also possible to use higher temperature spikes at higher temperatures, provided that no substantial damage is caused to the substrate (e.g., rapid thermal processing).

Annealing times are generally in the range of about 1 second to about 24 hours, preferably in the range of about 30 seconds to about 1 hour, and more preferably in the range of about 1 minute to about 30 minutes.

It is preferred that the annealing be carried out in a gas ambient that will not react with or cause any undue effects to the silicon and doping metal layers. Preferably, the annealing is carried out in a gas that is inert to the silicon and doping metal layers. Non-limiting examples of suitable gases in which to carry out the annealing include nitrogen, argon, helium, or any other gas substantially inert to the system.

Etching

Once the silicon and doping metal layers have been annealed, the next step is to selectively etch the metal film in a desired pattern (for example, in a grid pattern for solar cells on the top to provide an electrical contact as well as allow passage of light).

The process of the present invention provides a structure having a natural roughened surface, providing a natural antireflection effect, an added advantage for certain applications, and thus eliminating the need for an expensive surface roughening step.

The products of the present invention will have utility in a wide variety of applications, non-limiting examples of which include, solar cells, multi-junctioned or stacked solar cells, integrated circuit applications, thin film transistors, and thermophotovoltaic IR mirrors.

EXAMPLES

The following examples are provided merely to illustrate embodiments of the present invention, and are not to limit the scope of the claims of the present invention.

Example 1

Doping of Silicon

Oxidized p-type <100> crystalline silicon wafers and Corning 7059 glass were used as substrates for a-Si:H film deposition. Crystalline silicon substrates were first cleaned in PIRANHA solution and then oxidized using the wet oxidation method. The grown oxide thickness was approximately 5000 Å. The glass substrates were degreased using TCE, acetone, and methanol in an ultrasonic bath.

Phosphorous doped ($n^+$) and intrinsic a-Si:H films were deposited on the oxidized silicon and glass substrates using a UHV plasma-enhanced-chemical-vapor-deposition (PECVD) system. During deposition, the temperature, pressure and power density were kept at 250° C., 500 mTorr and 50 mW/cm$^2$, respectively. A phosphorous concentration of 1% (phosphine to silane volume ratio of 1%) was used for all n type films. After deposition, the samples were allowed to cool down to room temperature in vacuum. The chamber was then filled with dry nitrogen and the samples were immediately transferred to a thermal evaporation system where an Al film of approximately 6500 Å was deposited at room temperature.

For the n type a-Si:H samples on oxidized silicon substrate, conventional photolithography technique was used to define Al TLM pads. Two types of samples were prepared. Some of the samples were annealed before defining the Al pads. They are referred to as "annealed before patterning" (ABP) samples. The other set was annealed at different temperatures after defining the Al pads. They are referred to as "annealed after patterning" (AAP) samples. Thus, the ABP samples will have interacted a-Si:H film underneath as well as in between the Al contact pads, whereas the AAP samples will have interacted a-Si:H film only underneath the Al pad. A conceptual sketch of the AAP and ABP samples at different stages of the interactions is shown in FIG. 1. The TLM pad lengths used were 100 and 200 μm with a width of 500 μm. Distance between two pads varied from 5 to 70 μm. These samples were used for contact resistivity and sheet resistance measurements. Films deposited on Corning glass substrates were used for Raman, XRD, and Hall measurements. Hall measurement, XPS measurements and Raman measurement were done on the interacted a-Si:H surface after removing the Al film. Whereas X-ray diffraction analysis was done both before and after removing the Al film. The Al film was removed by a standard etching solution (85 parts phosphoric acid, 5 parts nitric acid, 5 parts acetic acid, and 5 parts DI water at 50° C.)

XPS spectra of the films were obtained using a Kratos Analytical system model AXIS HSi. Monochromatized AlKα radiation (E=1486.6 eV) was used as the X-ray source operating at 15 KV and 30 mA. At first survey spectra were taken over a 1 mm diameter analysis area. Higher energy resolution (pass energy=20 eV) $Si_{2p}$ spectra were obtained using a 120 μm analysis area. The $O_{1s}$ peak positions were aligned to take care of the charge shift for different samples and thus the true $Si_{2p}$ elemental peak position was found for different quality samples.

An HP 4145A semiconductor parameter analyzer was used to measure the resistance between TLM pads. A Renishaw micro Raman system model Raman System 2000 using a He—Ne 632.8 nm laser operating at 1 mw power was used for obtaining the Raman spectra. The spot size was 2 μm diameter. A Hitachi model S-2300 Scanning Electron Microscope (SEM) was used to analyze the surface morphology. A Bio-rad HL 5500 Hall effect measurement system was used for Hall mobility and carrier concentration measurement. Al interacted and crystallized a-Si:H films (both phosphorous doped and intrinsic) on glass substrates were used. Indium contacts were made at the four corners of approximately 1 cm$^2$ size samples. The measurements were done at room temperature and the magnetic field used was 0.32 Tesla, strong enough to have a stable Hall voltage.

A Phillips model X'pert System using a PW 3710 diffractometer control unit was used for XRD measurement. Cu Kα X-radiation was used as the X-ray source operating at 45 KV and 40 mA. X-ray diffraction spectra were taken both under regular θ-2θ and thin film optics configuration (glancing angle parallel beam geometry). Under the thin film optics configuration a 2θ scan was done with a very shallow fixed θ setting of 2.5°. A Xenon filled proportional counter detector was used for data collection in both configurations.

Electrical Characterization

Figure 2A:
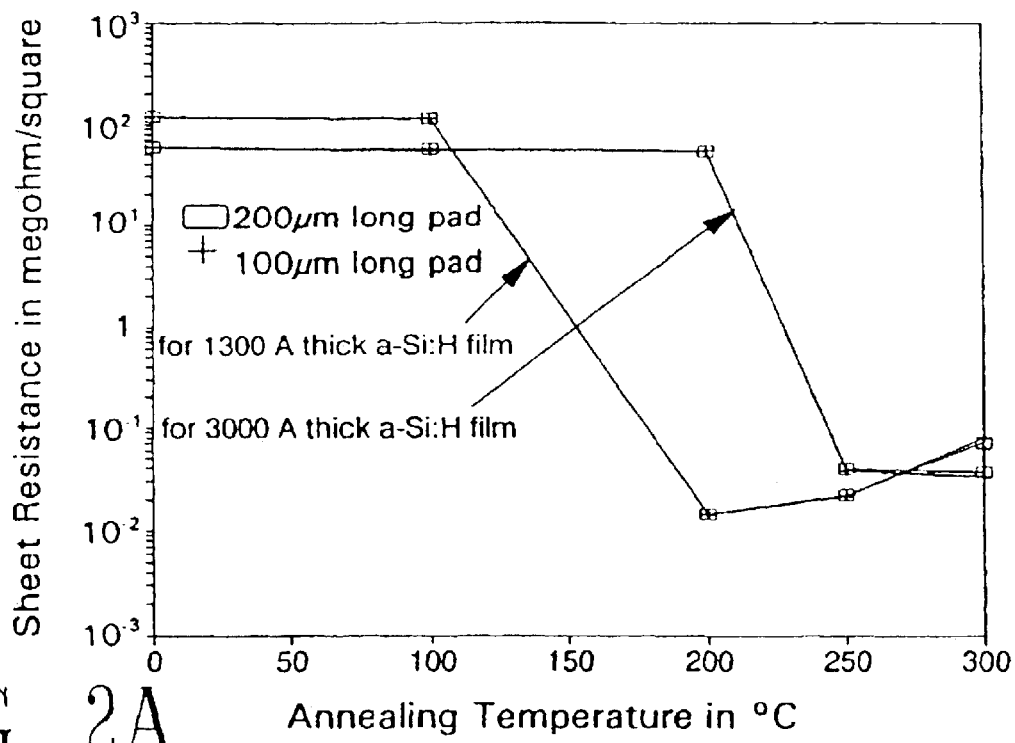
FIGS. 2A and 2B show the change in sheet resistance and contact resistivity for the ABP samples, respectively as a function of anneal temperature.
Figure 2B:
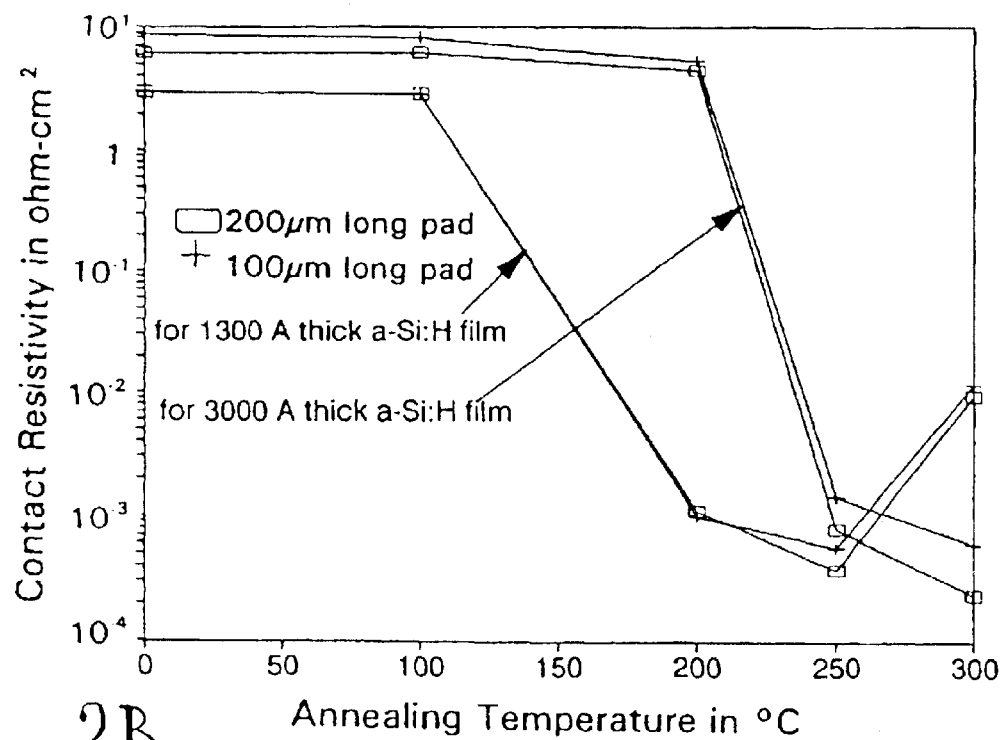

FIGS. 2A and 2B show the change in sheet resistance and contact resistivity for the ABP samples, respectively, as a function of anneal temperature. It is seen that beyond a certain temperature both the sheet resistance and the contact resistivity decrease by several orders of magnitude. This sudden change in sheet resistance and contact resistivity strongly suggests the formation of a continuous polycrystallized interacted layer. Considering that the whole thickness of the a-Si:H became crystallized; the resistivity of the films were calculated to be in the range of 0.08 to 0.13 Ω-cm.

High magnification SEM micrographs were taken to show the interacted film surface for the 1300 Å thick samples prepared at three different temperatures. For the 200° C. annealed sample, a smooth continuous defect free surface is obvious. For the 250° C. annealed film, small cracks and voids are observed at some places. For the 300° C. annealed film, bigger cracks and voids are observed and the film shows island like structures connected by narrow pathways all over the sample. These voids and cracks explain well the observed increase in sheet resistivity for the 300° C. processed thin (1300 Å) film. For the 3000 Å thick film, however, the 300° C. processed sample showed no such island formation. Also, the sheet resistance is minimum at the highest annealing temperature. Thus, a suitable anneal temperature needs to be chosen for a particular film thicknesses.

Figure 4A:
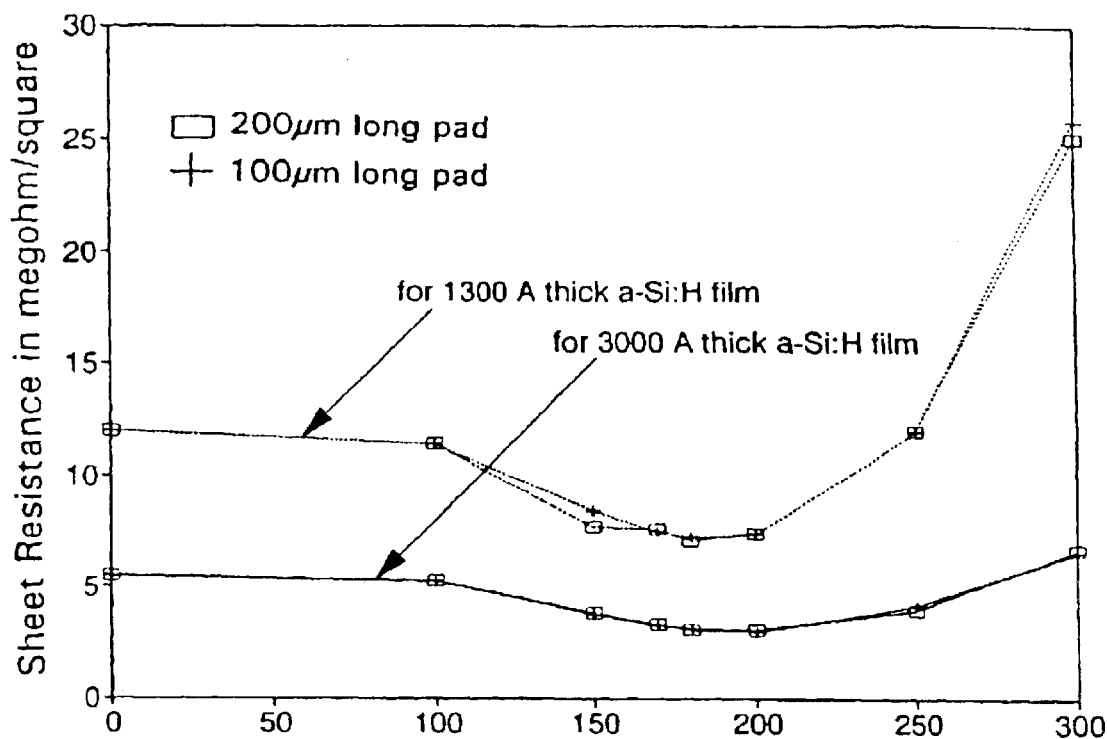
FIGS. 4A and 4B show the change in sheet resistance and contact resistivity of the AAP samples, as a function of anneal temperature, respectively.
Figure 4B:
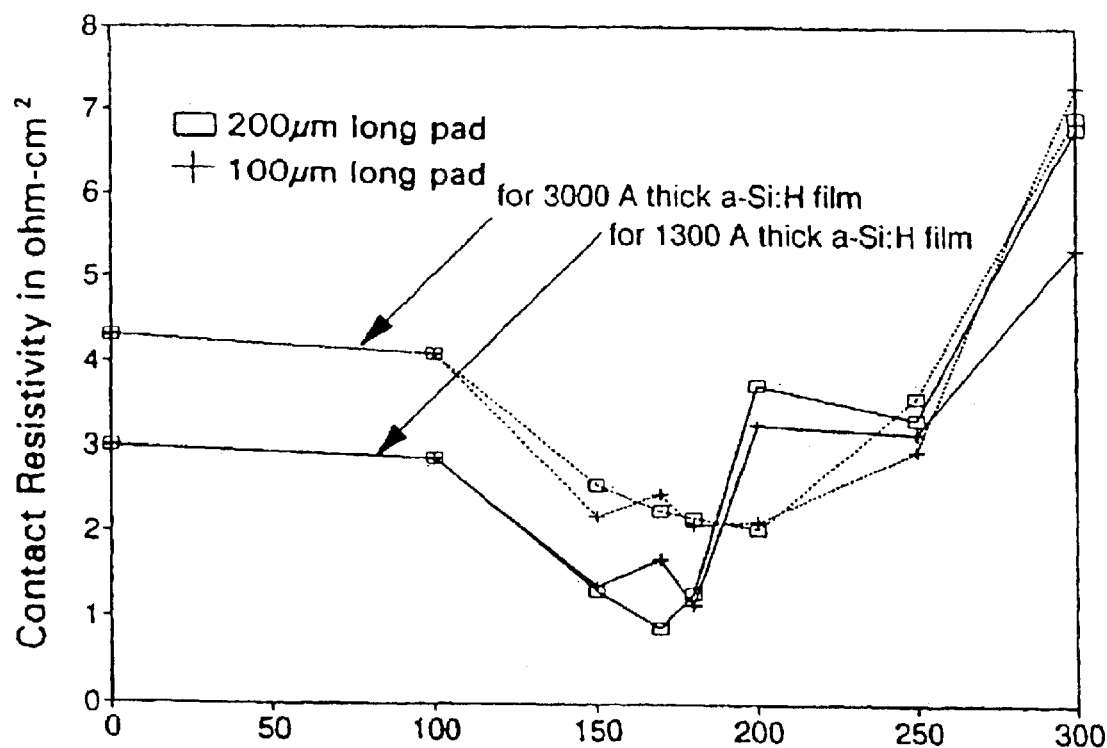

FIGS. 4A and 4B show the change in sheet resistance and contact resistivity of the AAP samples, as a function of anneal temperature, respectively. Both the sheet resistance and contact resistivity are seen to have a minimum value at around 200° C. and then an increase with increasing anneal temperature.

Hall Measurement Results

Electrical transport properties of the interacted films were analyzed by Hall measurement to determine the type, doping density and mobility. Measurements were done on both n type and intrinsic a-Si:H films interacted with Al. All the interacted crystallized films showed p type conduction. The mobility, carrier concentration and resistivity values for 300° C. annealed intrinsic sample were 1.4 cm$^2$/V-sec, 5×10$^{19}$ cm$^{-3}$ and 0.09 Ω-cm, respectively. For the 300° C. annealed counterdoped sample (sample that used n-type a-Si:H as the starting material) these values were 0.65 cm$^2$/V-sec, 4.69×10$^{19}$ cm$^{-3}$ and 0.21 Ω-cm, respectively. It is noticable that the resistivity values for the doped and counter doped crystallized samples are in the same range. The film resistivity values obtained during Hall measurement were in the range of 0.08–0.21 Ω-cm which is consistant with the values obtained by the TLM technique as discussed in the electrical characterization section (0.08–0.13 Ω-cm). For the obtained carrier concentrations, the resistivity values should be in this range according to the published data for p-type polycrystalline silicon.

Raman Spectroscopy

Figure 5:
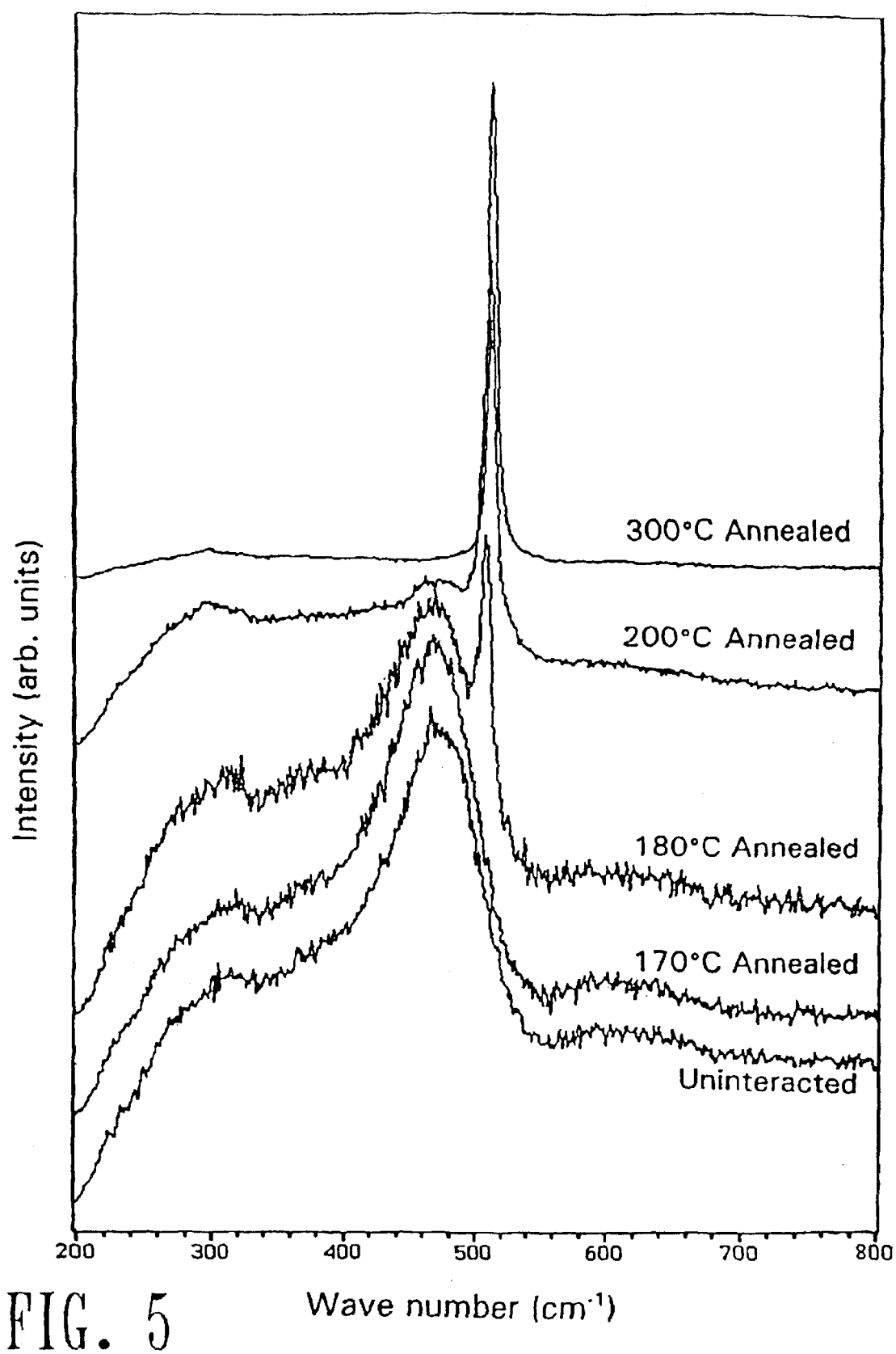
FIG. 5 shows the micro Raman spectra for the interacted a-Si:H films on glass substrates annealed at different temperatures.

Micro Raman spectroscopy was used to determine the crystallinity of the interacted region. FIG. 5 shows the micro Raman spectra for the interacted a-Si:H films on glass substrates annealed at different temperatures. The spectra for 200 and 300° C. interacted films are relatively smooth due to the fact that the intensity scale for these two spectra are an order of magnitude higher than those for the other three spectra. To confirm the crystallization for the AAP and ABP samples, Raman spectra were taken on the interacted region for these samples after removing the Al pad.

X-ray Diffraction

Figure 6A:
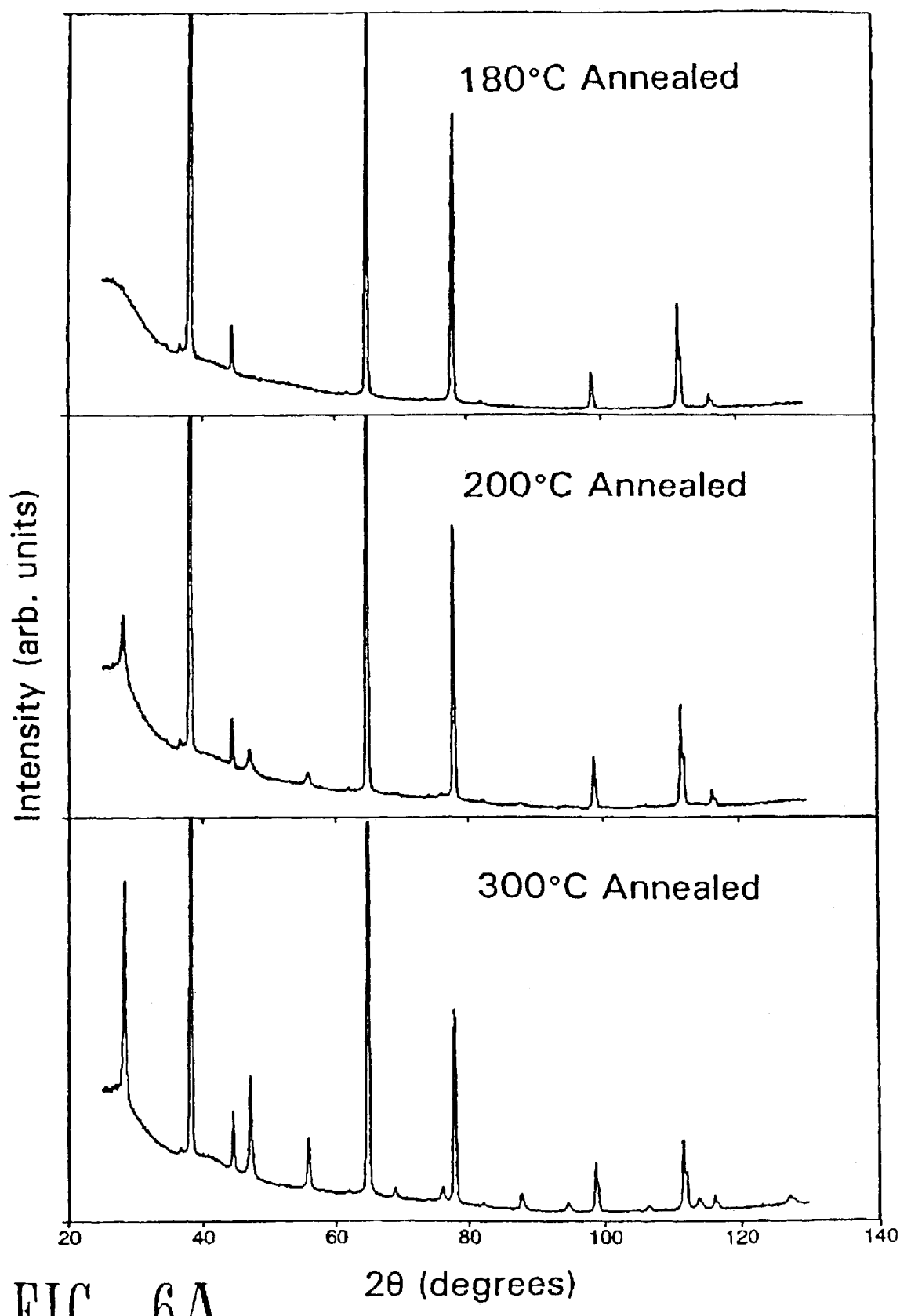
FIGS. 6A and 6B show X-ray diffraction spectra taken for the 180, 200 and 300° C. annealed samples using the thin film optics configuration.
Figure 6B:
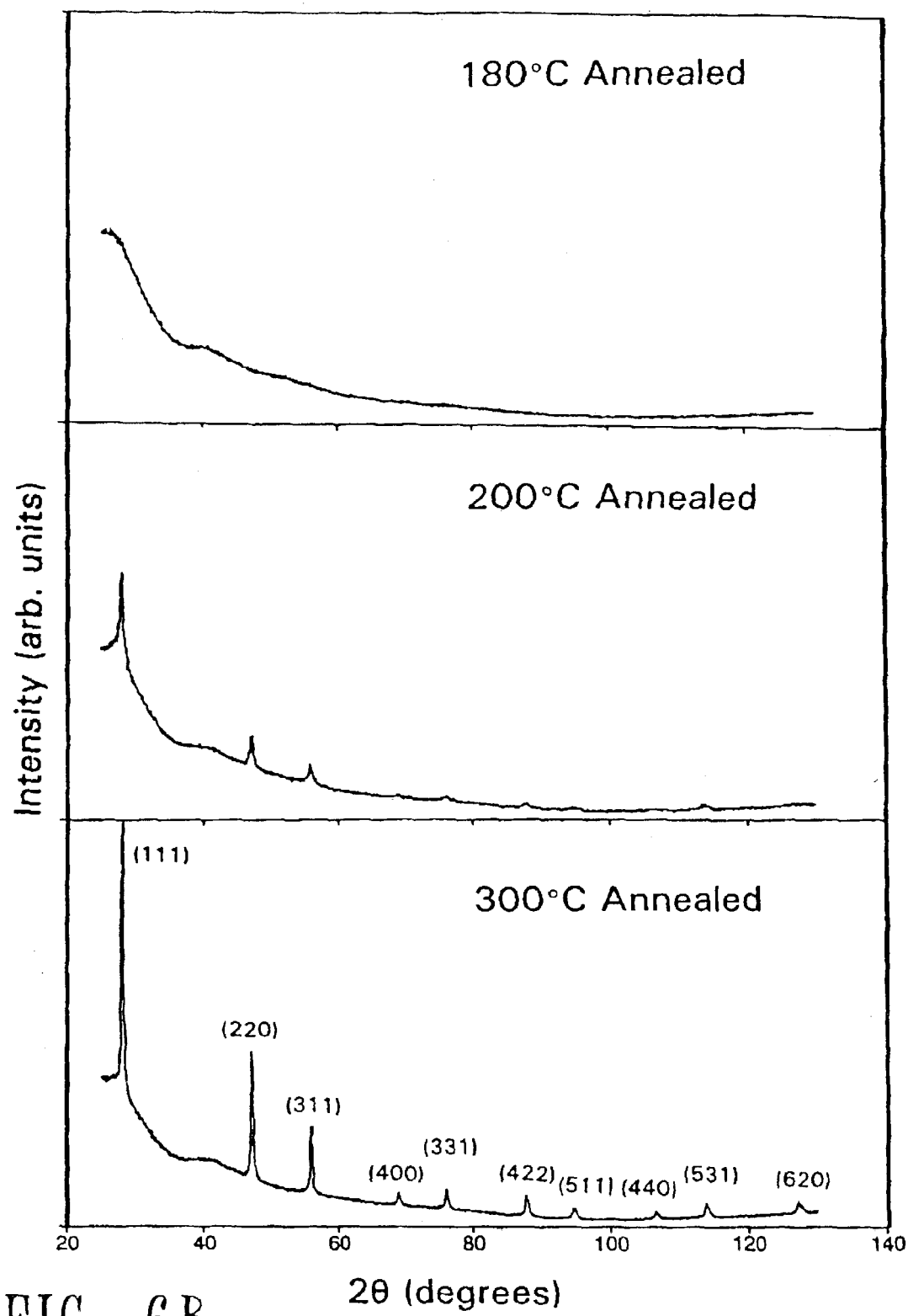

FIGS. 6A and 6B show X-ray diffraction spectra taken for the 180, 200 and 300° C. annealed samples using the thin film optics configuration. No crystalline silicon peaks were observed for annealing below 200° C. For annealing-at and above 200° C., all ten crystalline silicon peaks were observed which indicates the formation of a good polycrystalline film (without any preferred orientation).

XPS Analysis Results

Figure 7:
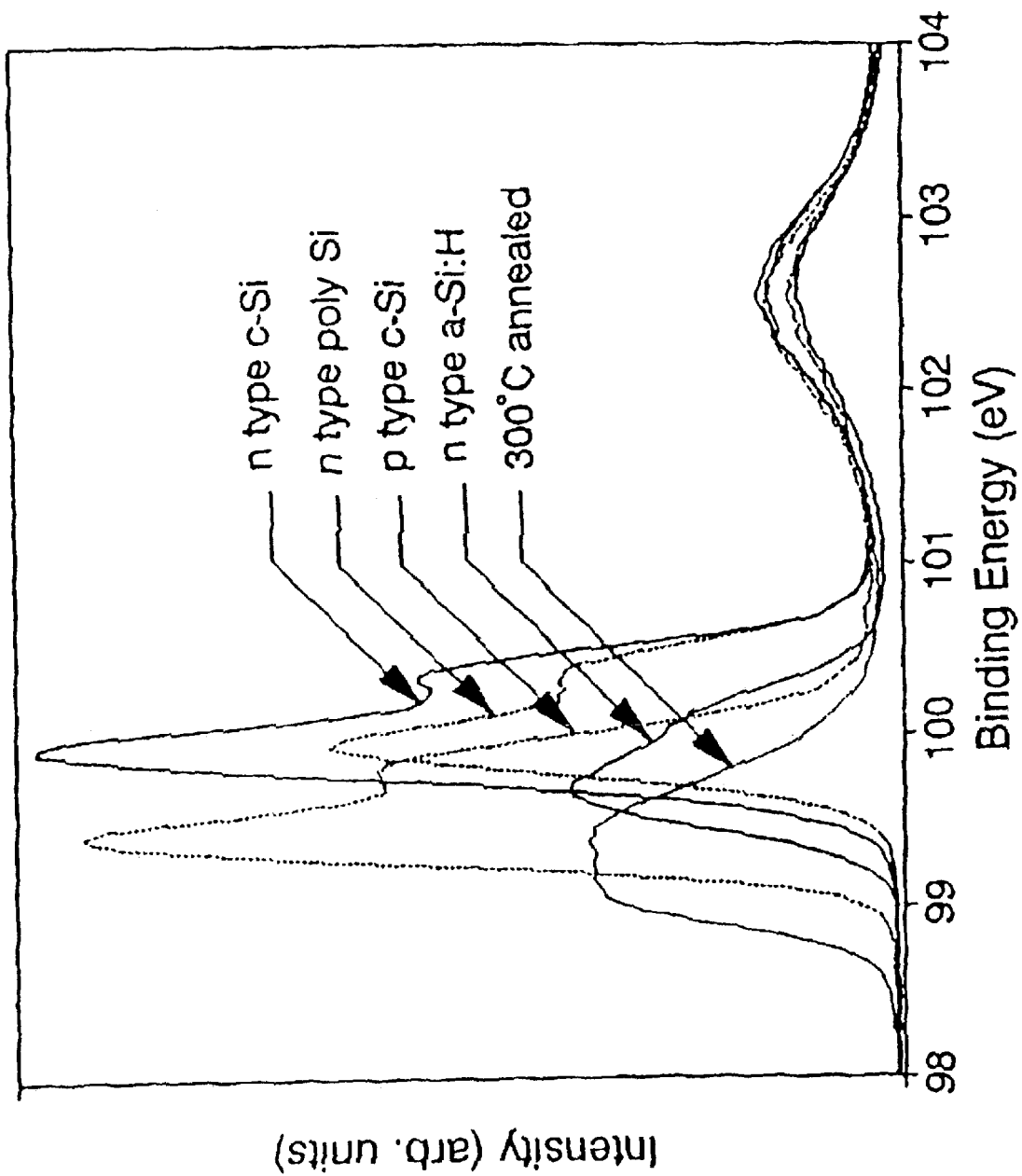
FIG. 7 is an XPS spectra showing $Si_{2p}$ binding energies of different silicon based samples.
Figure 9:
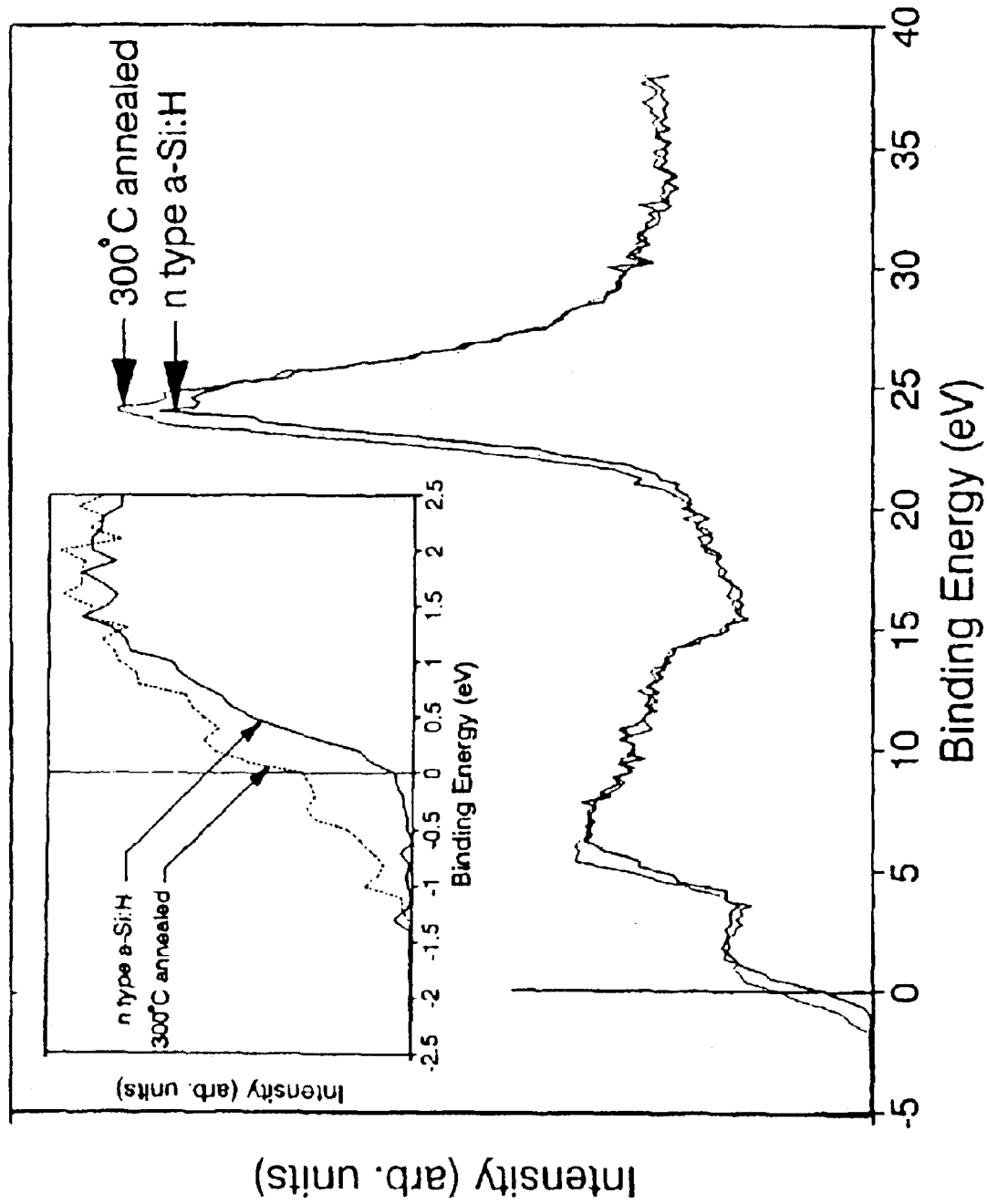
FIG. 9 shows the valence band spectrum of uninteracted and 300° C. annealed interacted $n^+$ a-Si:H film, with the Fermi edge shown in the inset.

XPS has been used as an efficient tool for investigation of a-Si:H/Al interaction. FIG. 7 is an XPS spectra showing Si$_{2p}$ binding energies of different silicon based samples. FIGS. 8A and 8B shows the conceptional band structures of n-type a-Si:H with (a) n-type and (b) p-type c-Si. FIG. 9 shows the valence band spectrum of uninteracted and 300° C. annealed interacted n$^+$ a-Si:H film, with the Fermi edge shown in the inset.

Example 2

Solar Cells

Solar Cell Fabrication Procedure

1. Clean the single/multi-crystalline silicon substrate by a standard cleaning procedure.
2. Do a 20:1 HF dip for 15 seconds to remove any native oxide and to passivate the silicon surface that will help reduce interface state density.
3. Deposit a layer of amorphous silicon film a 250° C. using a plasma-enhanced chemical vapor deposition (PECVD) technique.
4. Immediately afterwards, deposit an appropriate metal film the amorphous silicon film. For example, aluminum metal if the silicon substrate selected to be n-type to make p-n type structure. If metal deposition is not possible immediately after, do an HF dip to remove native oxide and contaminants from the surface before doing the metallization.
5. Anneal the composite structure in an oven in flowing nitrogen for 30 minutes at 250° C.
6. Etch the metal film in a grid pattern on the top to have contacts as well as windows for light.
7. Do back side metallization.

The dark and light I-V characteristics of the solar cells were obtained using a Keithley model 236 source measure unit. Characterization under light was performed using an Oriel solar simulator to simulate AM 1.5 sunlight.

Solar Cell Results

Figure 3:
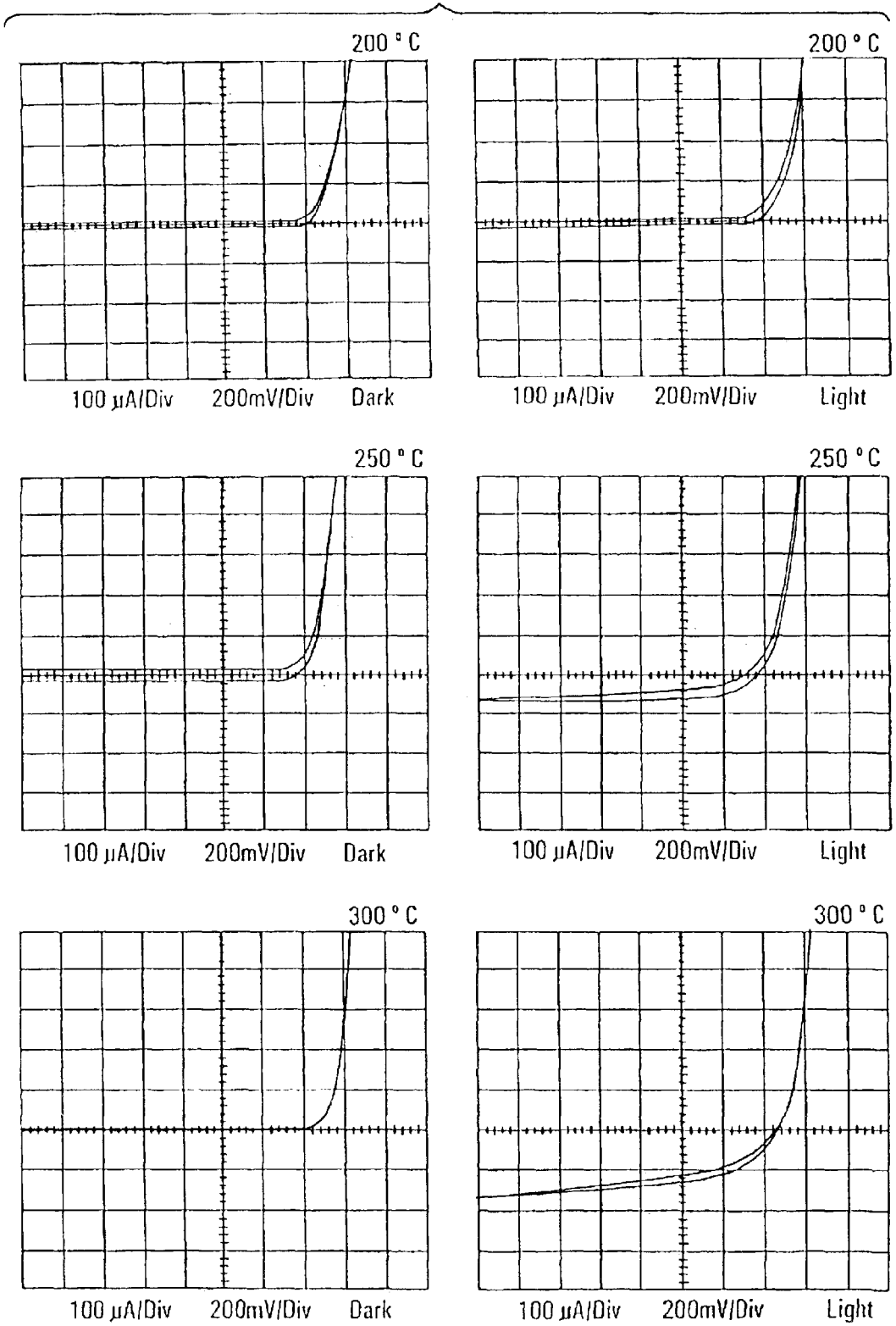
FIG. 3 shows the dark and light I-V characteristics of one of the fabricated solar cells.

FIG. 3 shows the dark and light I-V characteristics of one of the fabricated solar cells. A Voc valve 0.48 volts were obtained for the solar cell fabricated using a 1×10$^{15}$ cm$^{-3}$ doped n-type silicon substrate (Al was used to create a p-type layer on the top).

While the present invention is illustrated mainly by reference to silicon, it will be understood that the techniques apply equally well for other semiconductors suitable for use in the present invention. Non-limiting examples of other semiconductors include germanium, silicon-germanium alloys, germanium-carbon alloys, silicon-carbon alloys, and silicon-nitrogen alloys.

While the illustrative embodiments of the invention have been described with particularity, it will be understood that various other modifications will be apparent to and can be readily made by those skilled in the art without departing from the spirit and scope of the invention. Accordingly, it is not intended that the scope of the claims appended hereto be limited to the examples and descriptions set forth herein but rather that the claims be construed as encompassing all the features of patentable novelty which reside in the present invention, including all features which would be treated as equivalents thereof by those skilled in the art to which this invention pertains.

We claim:

1. In a process for manufacturing a semiconductor device, the improvement of forming a semiconductor junction by a method comprising:

(a) providing a semiconductor substrate;

(b) depositing a layer of amorphous silicon onto sold semiconductor substrate to form a structure comprising the semiconductor substrate and the layer of amorphous silicon;

(c) depositing a layer of metal onto said layer of amorphous silicon to form a structures comprising the semiconductor substrate, the layer of amorphous silicon, and the layer of metal; and (d) without depositing any additional layers onto the metal layer, annealing the structure formed in step (c) at a temperature in the range of about 170° C. to about 600° C. to convert at least a portion of the amorphous silicon layer into crystalline silicon, wherein the metal promoting the conversion of the at least a portion of the amorphous region into the crystalline silicon to a provide a semiconductor junction between said crystalline silicon and said semiconductor substrate.

2. The process of claim 1, wherein said semiconductor substrate is doped with a dopant of a first conductivity type and said layer of amorphous silicon in doped with a dopant of a second conductivity type opposite to that of said semiconductor substrate.

3. The process o claim 1, wherein said temperature in step (d) is less than about 450° C.

4. The process of claim 3, wherein said temperature in step (d) is in a range of about 200° C. to about 300° C.

5. The process of claim 1, wherein the metal include a doping metal which serves to promote the conversion of at least a portion of the amorphous silicon layer into the crystalline silicon and to dope the crystalline silicon.

6. The process of claim 5, wherein the doping metal is aluminum.

7. The process of claim 5, wherein the doping metal is effective to convert the at least a portion of the amorphous silicon layer from one n-type, intrinsic, or p-type material 6 to another upon crystallization.

8. The process of claim 7, wherein the doping metal is aluminum.

9. The process of claim 1, wherein said annealing is conducted for an annealing time in the range of about 1 second to about 24 hours.

10. The process of claim 9, wherein said annealing is conducted for an annealing time in the range of about 30 seconds to about 1 hour.

11. The process of claim 10, wherein said annealing is conducted for an annealing time in the range of about 1 minute to about 30 minutes.

12. In a process for manufacturing a semiconductor device, the improvement of forming a p-n junction by a method comprising:
(a) providing a crystalline silicon semiconductor substrate of a first conductivity type;
(b) depositing a layer of amorphous silicon onto said semiconductor substrate to form a structure comprising the semiconductor substrate and the layer of amorphous silicon;
(c) depositing a layer or doping metal onto said layer of amorphous silicon to form a structure comprising the semiconductor substrate, the layer of amorphous silicon, and the layer of doping metal, wherein said doping metal is selected to provide a dopant of a second conductivity type opposite to that of the semiconductor substrate; and
(d) without depositing any additional layers onto the metal layer, annealing the structure formed in step (c) at a temperature in the range of about 170° C. to about 600° C. to convert at least a portion of the amorphous silicon layer into crystalline silicondoped with the doping metal, wherein the doping metal promotes the conversion of the at least a portion of the amorphous silicon layer into crystalline silicon so as crystalline silicon and said crystalline silicon substrate.

13. The process of claim 12, wherein said temperature in step (d) is less than about 450° C.

14. The process claim 13, wherein said temperature in step (d) is in a range of about 200° C. to about 300° C.

15. The process claim 12, wherein the doping metal is aluminum.

16. The process claim 12, wherein the doping metal is effective to convert the at least a portion of the amorphous silicon layer from one of an n-type, intrinsic, or p-type material to another upon crystallization.

17. The process claim 16, wherein the doping metal is aluminum.

18. The process claim 12, wherein said annealing is conduct for an annealing time in the range of about 1 second to about 24 hours.

19. The process claim 18, wherein said annealing is conducted for an annealing time in the range of about 30 seconds to about 1 hour.

20. The process claim 19, wherein said annealing in conducted for an annealing time in the range of about 1 minute to about 30 minutes.

21. A process for making a semiconductor junction, comprising:
(a) depositing a semiconductor layer having an amorphous region onto a semiconductor surface;
(b) depositing a layer of metal onto the amorphous region of the semiconductor layer to form a structure comprising the semiconductor surface, the semiconductor layer, and the metal layer; and
(c) without depositing any additional layers onto the metal layer, annealing the structure formed in step (b) at a temperature in the range of about 170° C. to about 600° C. so as to convert at least a portion of the amorphous region into a crystalline semiconductor having a junction with the semiconductor surface, wherein the metal of a first portion of the metal layer promotes the conversion of the at least a portion of the amorphous region into the crystalline semiconductor.

22. The process claim 21, wherein said temperature in step (c) is less than about 450° C.

23. The process claim 22, wherein said temperature in step (d) is in a range of about 200° C. to about 300° C.

24. The process claim 21, wherein the metal include a doping metal which serves to promote the conversion of at least a portion of the amorphous region into the crystalline semiconductor and to dope the crystalline semiconductor.

25. The process claim 24, wherein the doping metal is aluminum.

26. The process claim 24, wherein the doping metal is effective to convert the at least a portion of the amorphous region from one of an n-type, intrinsic, or p-type material to another upon crystallization.

27. The process claim 26, wherein the doping metal is aluminum.

28. The process claim 21, wherein said annealing is conducted for an annealing time in the range of about 1 seconds to about 24 hour.

29. The process claim 28, wherein said annealing in conducted for an annealing time in the range of about 30 seconds to about 1 hour.

30. The process claim 29, wherein said annealing is conducted for an annealing time in the range of about 1 minute to about 30 minutes.

31. A process for making a semiconductor junction comprising:
(a) providing a structure including a semiconductor surface, a semiconductor layer having an amorphous region an the semiconductor surface, and a metal outer layer on the amorphous region;
(b) annealing the structure provided in step (a) at a temperature in the range of about 170° C. to about 600°

C. so as to convert at least a portion of the amorphous region into a crystalline semiconductor having a junction with the semiconductor surface, wherein the metal of a portion of the metal layer promotes the conversion of the at least a portion of the amorphous region into the crystalline semiconductor.

32. The process claim 31, wherein said temperature in step (b) is less than about 450° C.

33. The process claim 32, wherein said temperature in step (b) is in a range of about 200° C. to about 300° C.

34. The process claim 31, wherein the metal includes a doping metal which serves to promote the conversion of the at least a portion of the amorphous region into the crystalline semiconductor silicon and to dope the crystalline semiconductor.

35. The process claim 34, wherein the doping metal in aluminum.

36. The process claim 34, wherein the doping metal is effective to convert the at least a portion of the amorphous region from one of an n-type, intrinsic, or p-type material to another upon crystallization.

37. The process claim 36, wherein the doping metal is aluminum.

38. The process claim 31, wherein said annealing is conducted for an annealing time is the range of about 1 second to about 24 hours.

39. The process claim 38, wherein said annealing is conducted for an annealing time in the range of about 30 seconds to about 1 hour.

40. The process claim 39, wherein said annealing is conducted for an annealing time in the range of about 1 minute to about 30 minutes.

41. A process for making a semiconductor junction, comprising:
 (a) providing a structure including a semiconductor layer having an amorphous semiconductor region disposed thereon, and metal on the amorphous region with no additional layer being formed over the metal;
 (b) annealing the structure provided in step (a) at a temperature in the range of about 170° C. to about 600° C. so as to convert at least a portion of the amorphous region into a crystalline semiconductor having a junction with the semiconductor layer, wherein the metal includes a portion that promotes the conversion of the at least a portion of the amorphous region into the crystalline semiconductor.

42. The process claim 41, wherein said temperature in step (b) is less than about 450° C.

43. The process claim 42, wherein said temperature in step (b) is in a range of about 200° C. to about 300° C.

44. The process claim 43, wherein the metal includes a doping metal which serves to promote the conversion of the at least a portion of the amorphous region into the crystalline semiconductor and to dope the crystalline semiconductor.

45. The process claim 44, wherein the doping metal is aluminum.

46. The process claim 44, wherein the doping metal in effective to convert the at least a portion of the amorphous region from one of an n-type, intrinsic, or p-type material to another upon crystallization.

47. The process claim 46, wherein the doping metal is aluminum.

48. The process claim 41, wherein said annealing is conducted for an annealing time in the range of about 1 seconds to about 24 hours.

49. The process claim 48, wherein said annealing is conducted for an annealing time in the range of about 30 seconds to about 1 hour.

50. The process claim 49, wherein said annealing is conducted for an annealing time in the range of about 1 minute to about 30 minutes.

* * * * *